United States Patent
Lefoul

(10) Patent No.: US 8,629,391 B2
(45) Date of Patent: Jan. 14, 2014

(54) DETECTION DEVICE COMPRISING A RUGGED TEST WITH DUAL TRANSISTOR

(75) Inventor: Xavier Lefoul, Grenoble (FR)

(73) Assignee: Societe Francaise de Detecteurs Infrarouges-Sofradir, Chatenay Malabry (FR)

( * ) Notice: Subject to any disclaimer, the term of this patent is extended or adjusted under 35 U.S.C. 154(b) by 223 days.

(21) Appl. No.: 13/313,526

(22) Filed: Dec. 7, 2011

(65) Prior Publication Data

US 2012/0138776 A1    Jun. 7, 2012

(30) Foreign Application Priority Data

Dec. 7, 2010    (FR) ...................................... 10 04761

(51) Int. Cl.
*H01J 40/14* (2006.01)

(52) U.S. Cl.
USPC .................................. 250/214 R; 250/214.1

(58) Field of Classification Search
USPC ........ 250/214 R, 214.1, 208.1; 257/290–292, 257/226, 229; 327/514, 515; 348/302–311
See application file for complete search history.

(56) References Cited

U.S. PATENT DOCUMENTS 6,445,022 B1 * 9/2002 Barna et al. .................... 257/292
2010/0283474 A1 11/2010 Fukuda et al.

* cited by examiner

*Primary Examiner* — Que T Le
(74) *Attorney, Agent, or Firm* — Oliff & Beridge, PLC

(57) ABSTRACT

The detection device comprises a photodetector provided with first and second terminals. A readout circuit has an input coupled to the first terminal of the photodetector. A bias circuit imposes a bias on the terminals of the photodetector. A test circuit delivers a test current to the photodetector. The test circuit comprises a first transistor through which the test current flows. The first transistor presents a first main electrode connected to the input of the readout circuit and configured so as to have a junction diode opposing flow of the charge carriers when the photodetector is short-circuited.

4 Claims, 2 Drawing Sheets

DETECTION DEVICE COMPRISING A RUGGED TEST WITH DUAL TRANSISTOR

BACKGROUND OF THE INVENTION

The invention relates to a detection device comprising a photodetector provided with first and second terminals, a readout circuit provided with an input coupled to the first terminal of the photodetector, and a bias circuit imposing a bias on the terminals of the photodetector.

STATE OF THE ART

In conventional manner, a detection device comprises a photodetector and a readout circuit. The photodetector is subjected to particular bias conditions so as to deliver a current representative of the observed scene.

The current coming from the photodetector is conveyed to the readout circuit which performs processing of the information.

To ensure that the obtained result is representative of the observed scene, operation of the photodetector has to be able to be decorrelated from that of readout circuit in order to determine which element is defective.

To confirm that the readout circuit is functional or defective, the latter is tested independently from the photodetector. Thus, when a malfunction occurs, it is possible to determine whether the latter originates from the part comprising the photodetector or from the part comprising the readout circuit.

In order to preserve a high integration density and ease of use, it is interesting to integrate this test circuit as close as possible to the detection device.

OBJECT OF THE INVENTION

It is observed that a requirement exists to provide a detection device that is simple, compact and rugged while at the same time enabling detection of malfunctioning between the photodetector and the readout circuit.

This requirement tends to be met by means of a detection device which comprises a test circuit delivering a test current to the photodetector, the test circuit comprising a first transistor through which the test current flows, the first transistor presenting a first main electrode coupled to the input of the readout circuit and configured such as to have a junction diode opposing flow of the charge carriers when the voltage present on the common terminal between the readout circuit and the test circuit reaches a threshold value.

BRIEF DESCRIPTION OF THE DRAWINGS

Other advantages and features will become more clearly apparent from the following description of particular embodiments of the invention, given for non-restrictive example purposes only and represented in the appended drawings in which.

DESCRIPTION OF A PREFERRED EMBODIMENT OF THE INVENTION

Figure 1:
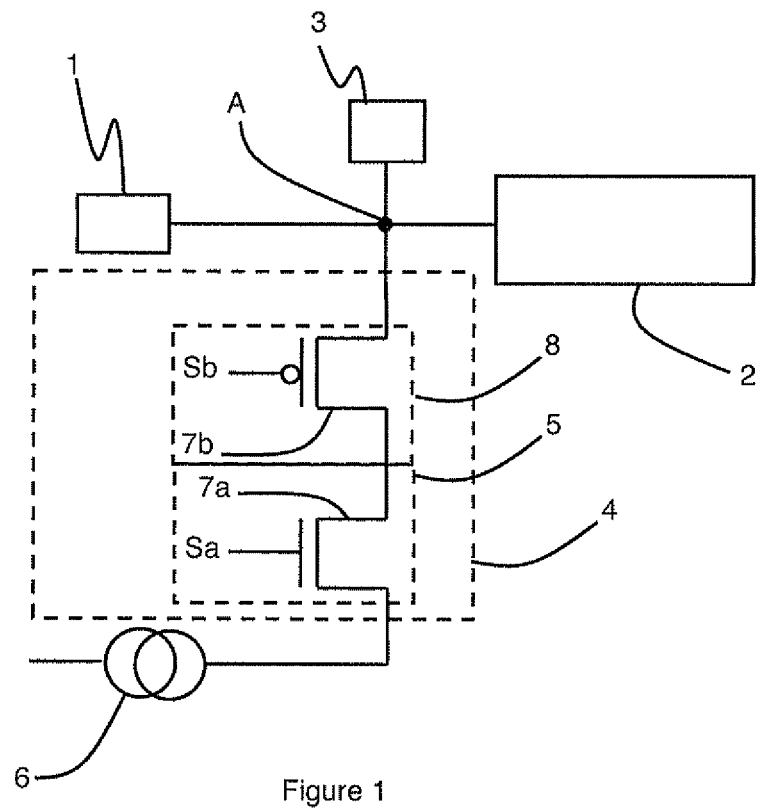
FIG. 1 represents a detection device, in schematic manner.

As illustrated in FIG. 1, the detection device comprises a photodetector 1 with first and second terminals. The first terminal of the photodetector is coupled to an input of a readout circuit 2. Readout circuit 2 receives the signal from photodetector 1 and processes the latter.

Photodetector 1 is subjected to a specific bias so as to make it operate in the required range. The bias at the terminals of the photodetector is obtained by means of a bias circuit 3. In general manner, photodetector 1 is a detection element on the terminals of which a voltage difference is applied.

Photodetector 1 delivers a current representative of the lighting of the observed scene. Photodetector 1 is preferably a photodiode which is reverse-biased in order to supply a current representative of the observed scene. Photodiode 1 is advantageously formed by an NIP, P/N N/I/P or P/I/N diode. However, depending on the type of photodetector used, the imposed bias changes.

For example purposes, the substrate is a P-conductivity substrate, the photo-diode is formed by a part of the semiconducting substrate and by an N-doped area formed in this substrate. If on the other hand the substrate is an N-conductivity substrate, the photodiode is formed by a part of the semi-conducting substrate and by a P-doped area formed in this substrate.

In certain embodiments, it is necessary to impose a large bias to ensure correct operation of the photodetector or set of photodetectors 1 organized in a matrix. For example purposes, the photodetector is an avalanche photodiode or a quantum-well device which requires application of a "reverse" bias of large amplitude. The large bias is advantageously applied via the substrate. Whatever the embodiment, the anode of photodetector 1 is the electrode presenting the lower potential and the cathode is the electrode presenting the higher potential. Depending on the potential applied the direction of the carrier current changes.

Readout circuit 2 can be of capacitive transimpedance amplifier (CTIA) type or of buffered direct injection (BDI) type. Readout circuit 2 performs acquisition of the signal emitted by the photodetector and processing of this signal. Readout circuit 2 has a transimpedance function which transforms the current signal emitted by photodetector 1 into a voltage signal. In advantageous manner, the current signal is integrated over a certain period of time to define the voltage signal. In also advantageous manner, readout circuit 2 comprises a capacitor which performs integration of the current delivered by photodetector 1.

Bias circuit performs biasing of photodetector 1 under the required conditions. In certain embodiments, bias circuit 3 is integrated in readout circuit 2. Readout circuit 2 then simultaneously performs biasing of photodetector 1 and acquisition and processing of the information coming from photodetector 1. In the embodiment of FIG. 1, bias circuit 3 is connected to the common node between readout circuit 2 and the photodetector. In the embodiment illustrated in FIGS. 2 and 3, biasing of photodetector 1 is performed by means of readout circuit 2.

The device also comprises a test circuit 4 which simulates operation of photodetector 1. For this purpose, test circuit 4 delivers a test current to readout circuit 2.

In this manner, it is possible to check operation of readout circuit 2 and operation of photodetector 1 independently. In advantageous manner, test circuit 4 is arranged as close as possible to readout circuit 2 to prevent parasite and/or distorted signals and to perform the best possible checking of operation of readout circuit 2. In order to obtain a compact device, test circuit 4 is of small size and comprises few active elements.

Test circuit 4 and photodetector 1 are both connected to the same input of readout circuit 2 which forms an electric node A. Between node A and readout circuit 2, the current delivered by test circuit 4 is in the same direction as the current coming from photodetector 1. Test circuit 4 sends a test current representative of the signal to be processed to readout circuit 2.

Test circuit 4 sends a current signal to readout circuit 2 in order to simulate operation of photodetector 1. Test circuit 4 comprises a circuitry 5 configured to modulate the current sent to read module 2. Although the direction of transit of the charge carriers changes according to the applied bias, test circuit 4 and photodetector 1 are considered to generate a current. Depending on the cases, the current transiting from photodetector 1 to the readout circuit is an electron hole current or an electron current.

In a particular embodiment, test circuit 4 comprises a current source 6 which is advantageously connected to readout circuit 2 by means of circuitry 5. Circuitry 5 comprises at least a first transistor 7a. Test circuit 4 also comprises a protection device 8 with a second transistor 7b. Second transistor 7b is connected between circuitry 5 and node A. The test current flows through the two transistors 7a, 7b, which transistors 7a, 7b are of opposite types and coupled in series. More than two transistors can however be integrated in test circuit 4.

Depending on the number of transistors integrated in circuit 5, the latter receives at least two control signals Sa, Sb which perform control of the different transistors 7a, 7b. Depending on the imposed signals, transistors 7 are therefore in an on or off state.

Figure 2:
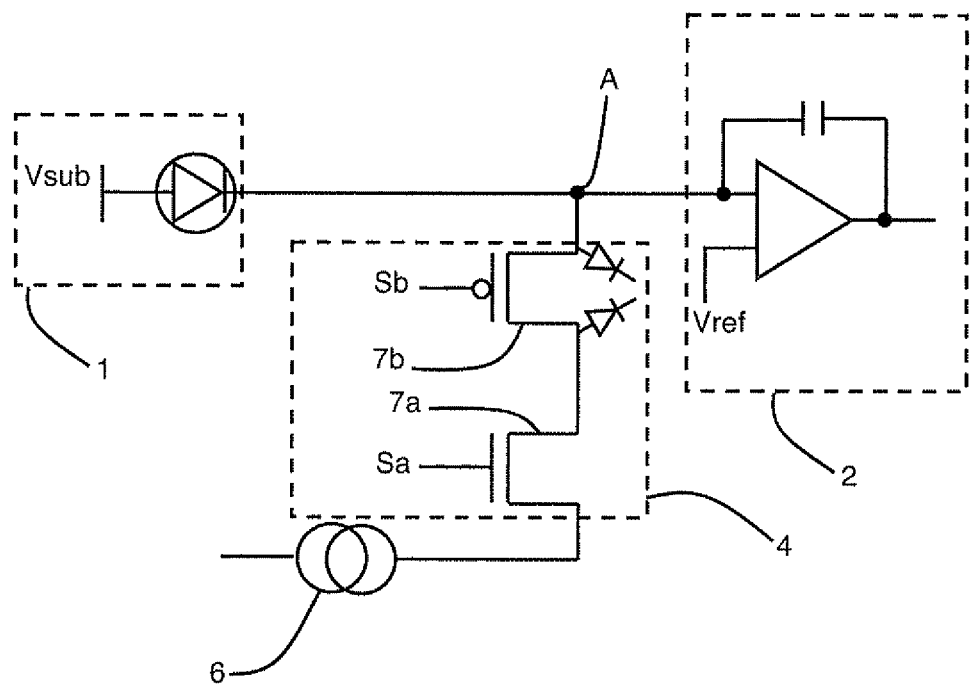
FIG. 2 represents a particular embodiment of a detection device, in schematic manner.

An embodiment illustrated in FIG. 2, current source 6 sends a signal representative of operation of the photodetector. Circuitry 5 and protection device 8 enable or disable flow of the current between current source 6 and readout circuit 2. Signals Sa and Sb are therefore of digital type switching transistors 7a and 7b between off and on states. Fine modulation of the value of the current is performed by source 6. Depending on the embodiments, current source 6 can be integrated in the module which comprises the detection circuit or be an element external to this module.

Figure 3:
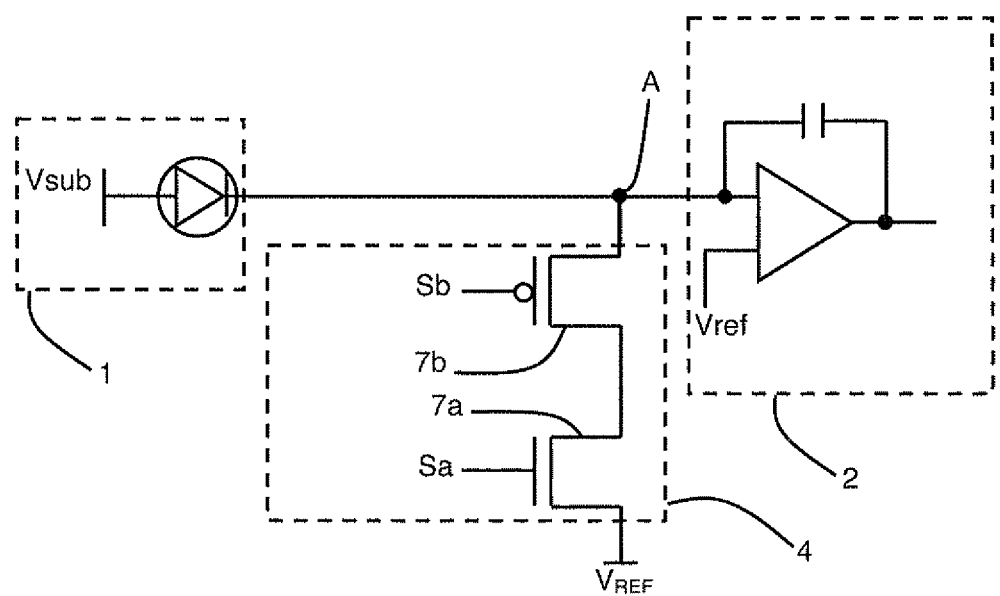
FIG. 3 represents another particular embodiment of a detection device, in schematic manner.

In another embodiment illustrated in FIG. 3, a test voltage $V_{TEST}$ is applied to an input terminal of test circuit 4. An output terminal of test circuit 4 is connected to the input of readout circuit 2 by node A. Circuitry 5 performs modulation of the intensity of the current flowing from the voltage applied on the input terminal to readout circuit 2 so as to simulate operation of photodetector 1. The current source then forms part of test circuit 4 by means of the circuitry 5. Voltage $V_{TEST}$ applied on the input terminal is chosen such as to obtain the same direction of transit of the carriers as photodetector 1. The potential difference that exists between node A and voltage. $V_{SUB}$ is of the same sign as the potential difference that exists between node A and voltage $V_{TEST}$. The control signal applied on circuitry 5 enables the quantity of current that is able to flow through to be modified. This also enables operation of photodetector 1 to be simulated. As in the previous embodiment, circuitry 5 comprises at least one transistor 7a.

In an alternative embodiment, transistor 7b of the circuitry 5 is also used to perform modulation of the current supplied by circuitry 5.

One or more signals Sa and Sb are applied to perform modulation of the current value. Signal Sb is of analog type whereas signal Sa can be of digital or analog type.

If photodetector 1 presents a malfunctioning which results in a short-circuit, the voltage applied on the substrate $V_{SUB}$ is also applied to electric node A. There is therefore a possibility that the substrate voltage or a voltage close to $V_{SUB}$ be applied to the input of readout circuit 2 and to test circuit 4. The bias of photodetector 1 is then transmitted to the various circuits of the device. The same is the case if the readout circuit imposes a potential on electric node A which results in photodetector 1 being switched to forward bias. For example purposes, the potential can change if the quantity of charges stored in the capacitor of the readout circuit is very large and if it does not comprise an anti-blooming device or if the latter is defective.

When photodetector 1 is short-circuited, substrate voltage $V_{SUB}$ is transmitted to electric node A and therefore to the output of test circuit 4. This results in this voltage being applied on one of the source/drain electrodes of second transistor 7b of protection device 8.

The same is the case if readout circuit 2 imposes a shifted voltage on node A which for example switches photodetector 1 to forward bias, for example due to a too high current flux imposed by the photodetector stored in an integration capacitor.

If the photodetector can be assimilated to a reverse-biased photodiode, a weaker voltage is imposed on the anode compared with the voltage imposed on the cathode. In the case of a P/N or NIP junction, this results in the P-doped area being at a lower potential than the N-doped area.

In transistors 7, there is at least one P-doped area and one N-doped area. Transistor 7 comprises a first main electrode, a second main electrode and a control electrode. The first and second main electrodes are formed by areas of the same type of doping which are separated by an area of opposite doping. In transistor 7, there are therefore two junction diodes formed by the connection between the two areas with different dopings. Each main electrode is associated with a junction diode. The junction diodes are represented for illustration purposes on transistor 7b of FIG. 2.

When the substrate voltage $V_{SUB}$ is applied to node A, this same substrate voltage is applied to the input of the adjacent second transistor 7b, here called the first main electrode. To prevent the junction diode of the first main electrode from turning on, i.e. a weaker voltage is applied to the N-doped area than to the P-doped area, the type of second transistor 7b is chosen accordingly. Second transistor 7b then presents main electrodes having a type of conductivity that is the opposite of that of the electrode connected to readout circuit 2. The diode of the photodetector and the junction diode on input of second transistor 7b are thus coupled in the same direction. In general manner, the type of the second transistor is chosen such that the junction diode prevents flow of current when photodetector 1 is short-circuited, i.e. when substrate voltage $V_{SUB}$ is present on node A. An identical reasoning can be applied when the potential of node A is shifted on account of readout circuit 2. In general manner, the second transistor is configured such as to have a junction diode opposing flow of the charge carriers when the potential present on the common terminal between readout circuit 2 and test circuit 4 reaches a threshold value, here a minimum value in FIGS. 2 and 3.

In a particular embodiment, the cathode (N-doped area of a diode) of photodetector 1 is connected to read module 2. Second transistor 7b is of pMOS type, so there is therefore a P-doped main electrode connected to node A. The diode junction is formed by the main electrode and the substrate. The diode junction is arranged in the same direction as the equivalent diode of the photodetector when the electrons transit from photodetector 1 to the substrate containing second transistor 7b. Test circuit 4 comprises two transistors 7a and 7b of opposite types connected in series, the type of second transistor 7b being fixed by the voltage difference that exists at the terminals of the photodetector. In an embodiment that is advantageous as it is compact, the test circuit is formed by transistors 7a and 7b. The test circuit can then be associated with a current source or with a voltage source.

As illustrated in FIG. 1, a pMOS transistor 7b is connected in series with an nMOS transistor 7a between current source 6 and electric node A, i.e. between current source 6 and the input of readout circuit 2. First transistor 7a is separated from readout circuit 2 by second transistor 7b.

In FIG. 2, transistor 7b connected to node A is of pMOS type. If the carriers transit schematically from substrate voltage $V_{SUB}$ to test circuit 4, they pass through a first P/N junction in photodetector 1 and reach a second P/N junction in transistor 7b. In this case, substrate voltage $V_{SUB}$ applied to the P-doped area of transistor 7b reverse-biases this electrode. No current can flow as the junction diode of the first main electrode of transistor 7b coupled to node A is biased in such a way as to be turned-off.

If the bias set is reversed, the readout circuit is coupled to the anode of the photodetector and the transistor of the protection device is of nMOS type, i.e. second transistor 7b is of nMOS type.

The junction diode of transistor 7b is chosen so as to be in the same direction as the equivalent diode of the photodetector. This architectural particularity prevents the presence of a parasite current from the test circuit in the possible case of malfunctioning of the photodetector by short-circuiting.

Transistor 7b connected to node A is chosen in such a way as to prevent the appearance of a parasite current if the photodetector is short-circuited. Transistor 7a of opposite type enables a greater freedom of biasing to define the quantity of current that is able to flow to readout circuit 2 during the test phases. It also prevents the drain electrode of second transistor 7b from being directly connected to the current voltage source.

This architecture remains simple and compact as it is essentially formed by two transistors connected in series enabling it to be integrated as close as possible to readout circuit 2.

In the particular case illustrated in FIG. 2 where the readout circuit is of capacitive transimpedance amplifier type, biasing of the photodetector is performed between substrate voltage $V_{SUB}$ imposed on the substrate and reference voltage $V_{REF}$ imposed by readout circuit 2. Bias circuit 3 is integrated in readout circuit 2.

In normal operation, reference voltage $V_{REF}$ is present on node A. In case of short-circuiting of photodetector 1, substrate voltage $V_{SUB}$ is present on node A and the type of transistor 7a is chosen such that application of voltage $V_{SUB}$ on the first main terminal turns the junction diode off.

Biasing of transistors 7 is performed in conventional manner. In the case of a pMOS transistor, the voltage applied on the well containing the channel is more positive than the voltage applied on the source and drain electrodes. In the case of an nMOS transistor, the voltage applied on the well containing the channel is more negative than the voltage applied on the source and drain electrodes. In this way, the junction diodes of the source and drain electrodes are always turned off with respect to the well without however hampering operation of the transistor at the level of the channel.

The invention claimed is:

1. A detection device comprising:
a photodetector provided with first and second terminals,
a readout circuit provided with an input connected to the first terminal of the photodetector,
a bias circuit imposing a bias on the terminals of the photodetector,
a test circuit delivering a test current to the readout circuit,
a first transistor and a second transistor of opposite types connected in series through which the test current flows, the first transistor is separated from the readout circuit by the second transistor provided with a first main electrode coupled to the input of the readout circuit and configured so as to have a junction diode opposing flow of the charge carriers when the potential present on the second terminal of the photodetector is present on the first terminal of the photodetector.

2. The device according to claim 1, wherein the cathode of the photo-detector is connected to the readout circuit, the first transistor is of nMOS type and the second transistor is of pMOS type, or wherein the anode of the photodetector is connected to the readout circuit, the first transistor is of pMOS type and the second transistor is of nMOS type.

3. The device according to claim 1, wherein the test circuit comprises a current source.

4. The device according to claim 1, wherein a test voltage is applied to a terminal of the test circuit and the control electrode of the first transistor is connected to an analog device configured to apply a modulation voltage.

* * * * *